United States Patent [19]

Sawai et al.

[11] Patent Number: 5,694,052
[45] Date of Patent: Dec. 2, 1997

[54] METHOD AND SYSTEM FOR ANALYSIS AND EVALUATION OF SEMICONDUCTOR CIRCUIT PERFORMANCE CHARACTERISTIC

[75] Inventors: Toshitsugu Sawai, Nara; Toshiro Akino, Osaka, both of Japan

[73] Assignee: Matsushita Electric Industrial Co., Ltd., Osaka, Japan

[21] Appl. No.: 601,722

[22] Filed: Feb. 15, 1996

[30] Foreign Application Priority Data

Feb. 17, 1995 [JP] Japan .................... 7-029354

[51] Int. Cl.$^6$ .......................... G01R 31/28; G06F 15/60
[52] U.S. Cl. .................................. 324/769; 364/578
[58] Field of Search ........................ 324/765, 766, 324/767, 768, 769, 158.1; 364/468.28, 578, 489, 490

[56] References Cited

U.S. PATENT DOCUMENTS

| | | | |
|---|---|---|---|
| 4,386,403 | 5/1983 | Hsieh ....................... | 364/490 |
| 5,313,398 | 5/1994 | Rohrer et al. ............... | 364/578 |
| 5,404,319 | 4/1995 | Smith et al. ................ | 364/578 |

OTHER PUBLICATIONS

Yu–Hsu Chang et al., "Analytic Macromodeling and Simulation of Tightly–Coupled Mixed Analog–Digital Circuits", Proc. of 1992 IEEE Conference on Computer–Aided Design, pp. 244–247, 1992 (month unavailable).

Yung–Ho Shih et al., "Analytic Transient Solution of General MOS Circuit Primitives", IEEE Transactions on Computer–Aided Design, Jun. 1992, vol. 11, No. 6, pp. 719–731.

Bing J. Sheu et al., "BSIM: Berkeley Short–Channel IGFET Model for MOS Transistors", IEEE Journal of Solid–State Circuits, Aug. 1987, vol. SC–22, No. 4, pp. 558–565.

*Primary Examiner*—Ernest F. Karlsen
*Attorney, Agent, or Firm*—McDermott, Will & Emery

[57] ABSTRACT

A characteristic of a MOS transistor is represented using an equivalent model. The equivalent model shows a connection configuration made up of an electric current source which supplies an electric current and a resistor element which is connected in parallel with the electric current source. The electric current is given by the equation of $i=G_m \cdot (V_{GS}-V_T)$ for $V_{GS} \geq V_T$ where $G_m$ is a coefficient, $V_{GS}$ is a gate-to-source input voltage of said MOS transistor, and $V_T$ is a given threshold voltage. A plurality of operating zones of the MOS transistor are defined according to the drain, source, and gate terminal voltages of the MOS transistor and are assigned respective values of the coefficient $G_m$ and respective values of the resistor element's resistance. By such a representation, the circuit equation of a semiconductor circuit that is analyzed can be represented in the form of a linear time-invariant equation. Semiconductor circuit performance characteristics can be analyzed and evaluated at high accuracy and high speed.

6 Claims, 12 Drawing Sheets

$i = G_m(v_{GS} - V_T)$

NOTE: IF $V_{GS} < V_T$, THEN $G_m = 0$, $R = \infty$

Fig.5

| TYPE OF TRANSISTOR NMOS | | | | | | | |
|---|---|---|---|---|---|---|---|
| REGION NUMBERS | CHARACTERISTIC PARAMETERS | | | REGION BOUNDARY PARAMETERS | | | |
| | $G_m$ | $V_T$ | $1/R$ | $P_2$ | $P_1$ | $P_0$ | $V_{GS0}$ |
| 0, 0 | 0.0 | 0.0 | 7.5e-4 | 0.0 | 0.0 | 0.0 | 1.78 |
| 0, 1 | 6.0e-5 | 1.5 | 5.4e-4 | 0.0 | 2.9e-1 | 0.0 | 1.78 |
| 0, 2 | 1.9e-4 | 1.4 | 3.0e-4 | 0.0 | 5.4e-1 | 2.5e-2 | 1.78 |
| 0, 3 | ⋮ | ⋮ | ⋮ | ⋮ | ⋮ | ⋮ | ⋮ |
| 1, 0 | | | | | | | |
| 1, 1 | | | | | | | |

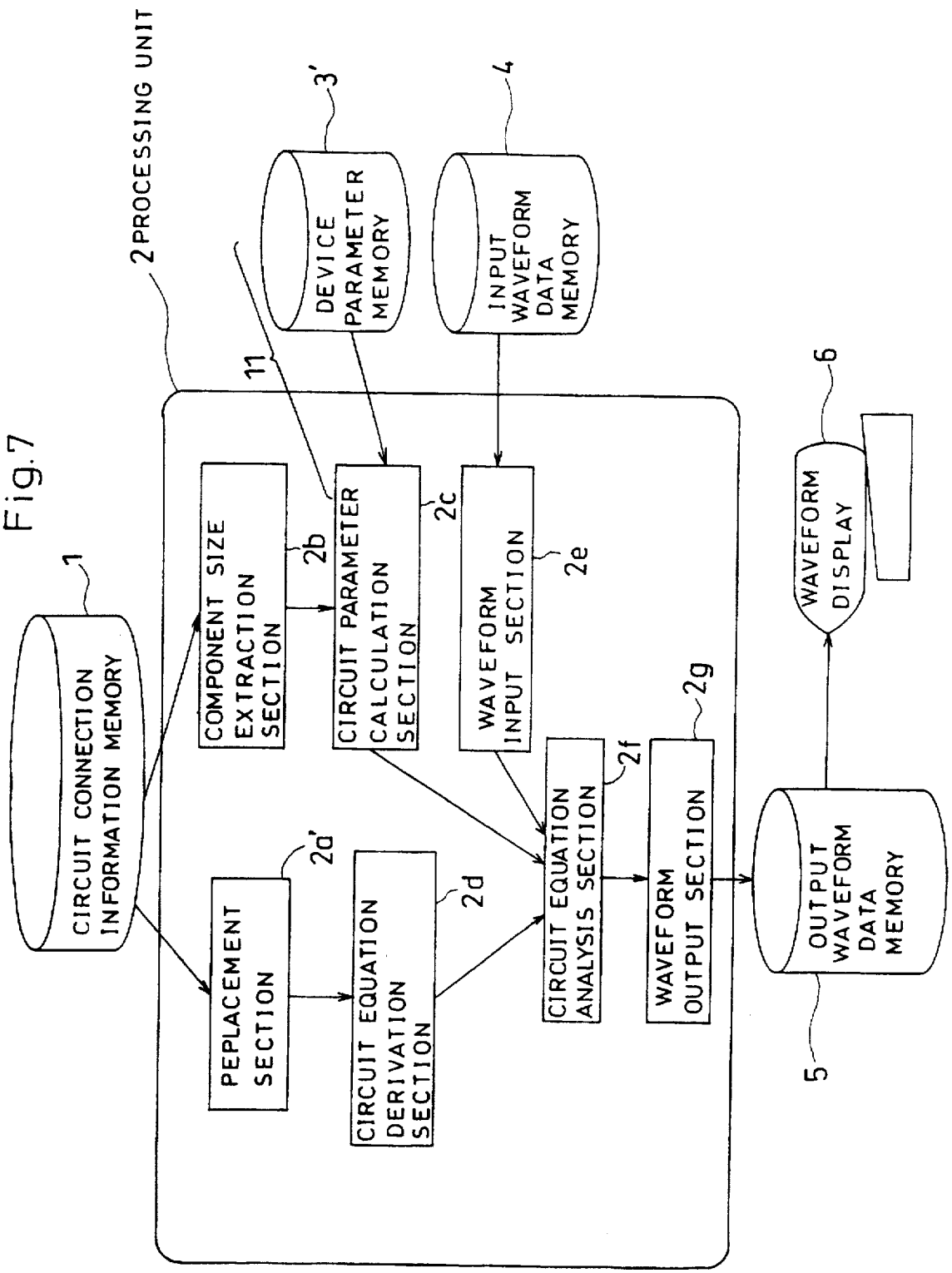

$i = G_{m1}(V_{GS} - V_{GS0})$    $V_{GS} \geq V_{GS0}$ $i = G_{m2}(V_{GS} - V_T)^2$    $V_T \leq V_{GS} < V_{GS0}$ NOTE: IF $V_{GS} < V_T$, THEN $G_m = 0$, $R = \infty$

METHOD AND SYSTEM FOR ANALYSIS AND EVALUATION OF SEMICONDUCTOR CIRCUIT PERFORMANCE CHARACTERISTIC

BACKGROUND OF THE INVENTION

The present invention is directed to an improved analytic method and system for analyzing and evaluating the performance characteristic of semiconductor circuits containing MOS transistors in the stage of design thereof.

Conventional methods of analyzing and evaluating the performance characteristic of semiconductor circuits containing MOS transistors can be broadly classified into three major categories. An example of the first category method is shown in a report entitled "BSIM: Berkeley Short-Channel IGFET Model for MOS Transistors," IEEE JOURNAL OF SOLID-STATE CIRCUITS, Vol.SC-22, No. 4, August 1987. A detailed device model is set at transistor level. This is followed by representing a semiconductor circuit that is analyzed with an equivalent circuit making use of that detailed device model. Thereafter, a circuit equation of the equivalent circuit, which is a very intricate non-linear differential equation and which represents an output and input relationship of the equivalent circuit, is derived. Next, this non-linear differential equation is solved by numerical calculations. In the second category method, a simple device model is set at transistor level. In accordance with this method, the equivalent circuit becomes uncomplicated since it makes use of a simple device model. As a result, the circuit equation can be mathematically solved without depending upon numerical calculations. Finally, it is assumed in the third category method that a macro containing plural transistors is regarded as a black box, and only the input/output characteristics of the black box are dealt with.

The first category method however has some drawbacks. Although, among the three methods, the first method is able to achieve the accuratest evaluation of semiconductor circuit performance characteristic, it involves extremely complicated non-linear circuit equations to be solved by means of numerical calculations. As a result, solving such a complicated circuit equation requires a great deal of calculation time. This means that the first category method finds applications, only in relatively small-scale semiconductor circuits. Various approaches to reduce the calculation time have been proposed such as the tabulation of transistor performance characteristics and the division of an entire semiconductor circuit into plural sub-circuits. These approaches however are not a fundamental solution to speeding up processing.

The third category method is now discussed. The third method, although very fast in processing, requires prederivation of the input/output characteristics of macros and databasization thereof. This limits the application of the third method, to semiconductor circuits of the macros entered into the database. Additionally, if the intensity of signal coupling between macros is great, this prevents satisfactory modelization, in other words the third method can be applied, only to macros with a weak signal coupling strength. As a result, the range of the application is limited to specific semiconductor circuits. Further, in the third method, a certain number of transistors are considered a cluster, so that it is impossible to individually take into account their respective characteristics. This results, of course, in the third method being poor in accuracy.

The second method, which is capable of balancing the accuracy with the processing rate, is therefore considered attractive and has been employed conventionally. FIG. 12 shows a simple example of the second method in which a MOS transistor of FIG. 12(a) is considered a serial circuit made up of a resistor and a switch (see FIG. 12(b)), and the entirety of a semiconductor circuit is represented by a combination of the serial circuit and a capacitor. This simple method, however, is somewhat poor in accuracy, since the characteristics of an actual transistor and its simulation are much different from each other. A report, which is entitled "Analytic Transient Solution of General MOS Circuit Primitives," IEEE TRANSACTIONS ON COMPUTER-AIDED DESIGN, vol. 11, No. 6, June 1992, shows a technique. There is shown a device model. Here, $I_k$ (the drain current) is expressed as the transistor characteristic by the equation of $I_k=K_k (L_k (V-G_k+T_k)^2-S_k (D_k-G_k+T_k)^2$. Additionally, a report, entitled "Analytic Macromodeling and Simulation of Tightly-Coupled Mixed Analog-Digital Circuits," IEEE CONFERENCE ON COMPUTER-AIDED DESIGN, pp. 244–247, 1992, shows a technique with a view to providing a solution to the above problem. There is shown on page 246 of the report a device model. $I_{ds}$ (the drain current) is expressed as the transistor characteristic by the equation of $I_{ds}=c_{xy} \cdot V_{gs} \cdot V_{ds} + c_x \cdot V_{gs} + c_y \cdot V_{ds} + c_c$. Further, with a view to achieving a higher accuracy, there have been proposed various approaches. For example, a device model represented by a quadratic equation is expressed by a combination of a plurality of linear equations.

Even in the second method, it involves, as shown above, a current equation which is not simple. Therefore, the circuit equation of an equivalent circuit resulting from representing a MOS transistor of a semiconductor circuit to be analyzed with a device model of the second method, becomes a non-linear differential equation. Such a non-linear differential equation, since the aforesaid devices are not very much complicated, is less complicated in relation to the one obtained by the first method. From the viewpoint of the analysis, however, the non-linear differential equation of the second method is still intricate. The second method suffers, as a result, the problem that it requires a great deal of processing time.

SUMMARY OF THE INVENTION

Bearing in mind the above-described problems associated with the prior art approaches, this invention was made. Accordingly, it is an object of the present invention to provide an improved method and system capable of time-saving analysis/evaluation of the performance characteristic of semiconductor circuits, with the accuracy of the analysis/evaluation held high.

Suppose the circuit equation of a semiconductor circuit to be analyzed is expressed by a linear time-invariant differential equation. In this case, such a circuit equation can be solved easily and the solution can be likewise expressed by a simple equation. From this knowledge, a MOS transistor device model, the circuit equation of which is expressed by a linear time-invariant differential equation, is employed in the present invention.

The present invention provides an analytic method capable of analyzing a characteristic of a semiconductor circuit containing MOS transistors. This analytic method comprises:

(a) premodeling a characteristic of a MOS transistor with an equivalent model;
    wherein the equivalent model shows a connection configuration which is composed of an electric current source for providing an electric current i and a resistor element connected in parallel with the electric current source;

wherein the electric current i is given by the equation of $i=G_m \cdot (V_{GS}-V_T)$ for $V_{GS} \geq V_T$ where $G_m$ is a coefficient. $V_{GS}$ is a gate-to-source input voltage of the MOS transistor, and $V_T$ is a given threshold voltage;

wherein values of the coefficient $G_m$ and values of the resistor element's resistance are set for a plurality of operation regions of the MOS transistor which are defined according to drain, source, and gate terminal voltages of the MOS transistor;

(b) replacing the MOS transistors of the semiconductor circuit that is analyzed with the MOS transistor equivalent model;

(c) deriving a circuit equation which expresses a relationship between the output voltage of the MOS transistor equivalent model circuit and the electric current i;

(d) solving the circuit equation;

wherein the circuit equation is reduced by means of CAD (computer aided design) to a linear time-invariant differential equation and the linear time-invariant differential equation is solved so as to analyze the performance characteristic of the semiconductor circuit.

In the present invention, the above-described MOS transistor model is employed, which makes it possible to represent the circuit equation of a semiconductor circuit with a linear time-invariant differential equation. The circuit equation can be solved with ease, thereby improving the speed and accuracy of analysis and evaluation of the performance characteristic of semiconductor circuits.

BRIEF DESCRIPTION OF THE DRAWINGS

These and other objects, features, and advantages of the present invention will be more readily apparent from the following detailed description of the preferred embodiments of this invention with reference to the accompanying drawing figures in which:

FIG. 5 shows a built-in table of a device parameter memory section of the first embodiment of the present invention;

FIG. 7 schematically depicts an analytic system, made in accordance with a second embodiment of the present invention, for analyzing the performance characteristic of semiconductor circuits;

DETAILED DESCRIPTION OF THE INVENTION

Preferred embodiments in accordance with the present invention are now illustrated by making reference to the accompanying drawing figures.

EMBODIMENT 1

Figure 1:
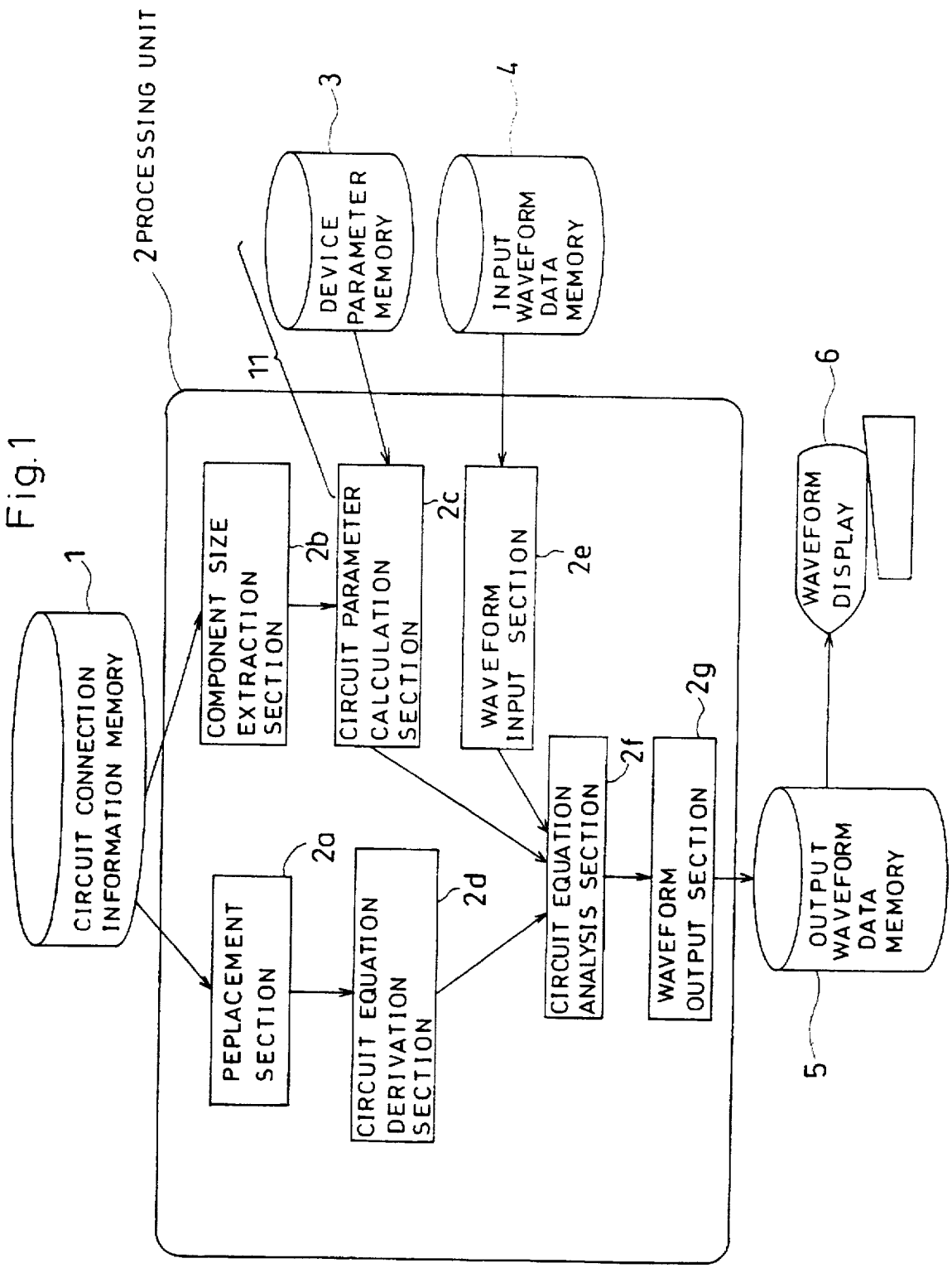
FIG. 1 schematically depicts an analytic system, made in accordance with a first embodiment of the present invention, for analyzing the performance characteristic of semiconductor circuits.

FIG. 1 shows an entire analytic system, made in accordance with the first embodiment, for analyzing the performance characteristic of semiconductor circuits.

Figure 6A:
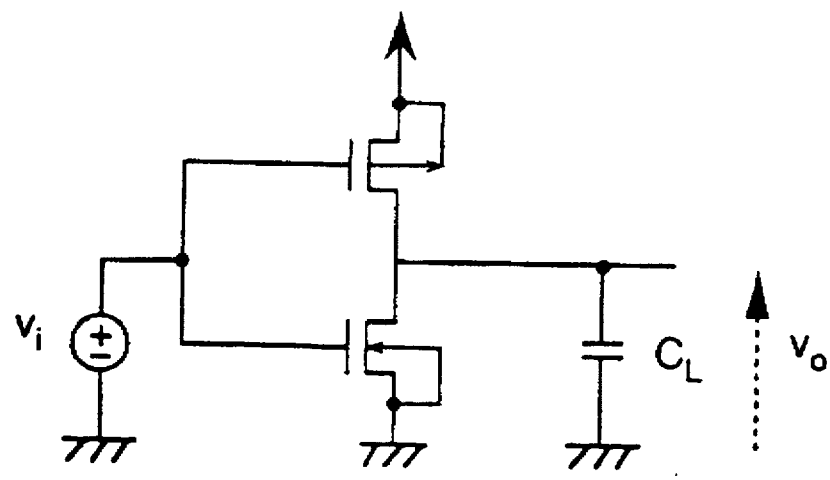
FIG. 6(a) schematically depicts a CMOS inverter circuit of the first embodiment of the present invention serving as a semiconductor circuit to be analyzed in performance characteristic and FIG. 6(b) schematically depicts an equivalent circuit to a CMOS inverter circuit of the first embodiment of the present invention serving as a semiconductor circuit to be analyzed in performance characteristic.

Reference numeral 1 denotes a circuit connection information memory section (CCIMS). CCIMS 1 prestores two types of information, the one is information as to connections between semiconductor components such as MOS transistors, resistors, and capacitors of a semiconductor circuit that is analyzed and the other is information as to, for example, the size of MOS transistor gates. An example where a semiconductor circuit to be analyzed takes the form of a CMOS inverter circuit of FIG. 6(a), is described.

Reference numeral 2 is a processing unit (PU) with a built-in program showing a procedure of analyzing, by means of CAD (computer-aided design), semiconductor circuit performance characteristics.

Figure 2A:
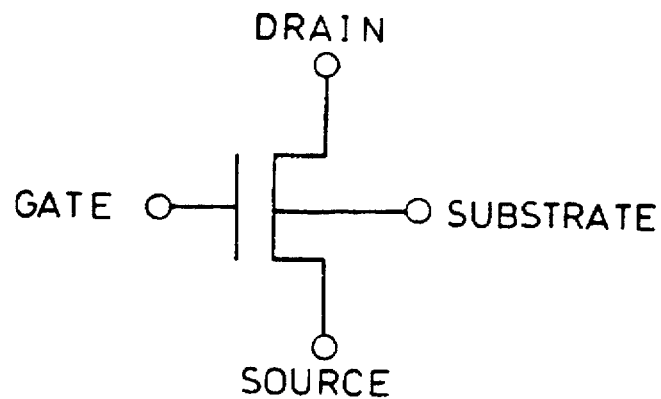
FIG. 2(a) shows a MOS transistor of the first embodiment of the present invention and FIG. 2(b) shows an equivalent model to a MOS transistor of the first embodiment of the present invention.
Figure 2B:
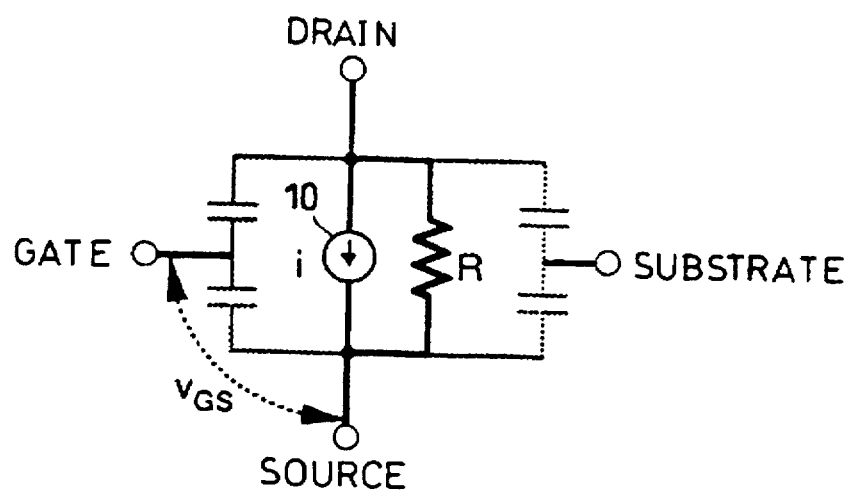

PU 2 has an equivalent model replacement section (EMRS) 2a. EMRS 2a takes in information as to connections between components of a semiconductor circuit that is analyzed (i.e., a CMOS inverter circuit shown in FIG. 6(a)). Based on the intercomponent connection information thus taken in, EMRS 2a creates connection information as to the replacement of a MOS transistor contained in the CMOS inverter circuit with an equivalent model. This replacement is demonstrated in detail. FIG. 2b shows a basic model of a MOS transistor of FIG. 2a which is prestored in EMRS 2a. This prestored model basically contains (A) an electric current source (ECS) 10, (B) a connection configuration represented by a resistor element R connected in parallel with ECS 10, and (C) a current equation for expressing an electric current i supplied from ECS 10 (see FIG. 2(b)). Interterminal (terminal-to-terminal) capacitance values between the drain, gate, and source of the FIG. 2(a) MOS transistor are added as the fixed capacitances to the basic model as necessity requires.

In the foregoing basic model, if $V_{GS} \geq V_T$ where $V_{GS}$ is the MOS transistor gate-source input voltage and $V_T$ is the given threshold voltage, the electric current i can be expressed by a linear (first-order) equation of the gate-source input voltage ($V_{GS}$) (i.e., the following equation (1)):

$$i = G_m(V_{GS} - V_T)$$

where $G_m$ is the coefficient of Eq. (1). If $V_{GS} < V_T$, then $G_m = 0$ and $R = \infty$.

Figure 6B:
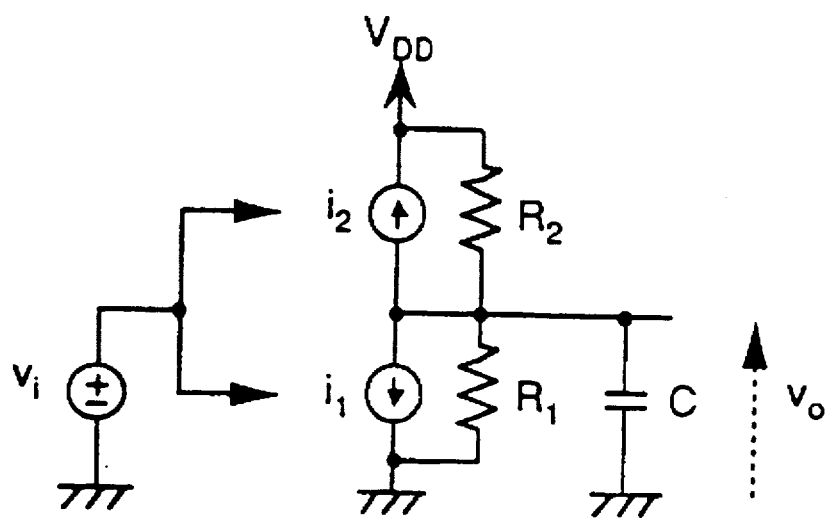

EMRS 2a inputs, out of the CCIMS 1, pieces of intercomponent connection information of the FIG. 6(a) CMOS inverter circuit. Based on the intercomponent connection information thus inputted, EMRS 2a creates connection information as to the replacement of a MOS transistor contained in the CMOS inverter circuit of FIG. 6(a) with an equivalent model of FIG. 2(b), whereupon the FIG. 6(a) CMOS inverter circuit is replaced by the FIG. 6(b) equivalent circuit. Referring to FIGS. 6(a) and 6(b), a load capacitance C is the capacitance resulting from adding a MOS transistor interterminal capacitance to a load capacitance CL.

Figure 3:
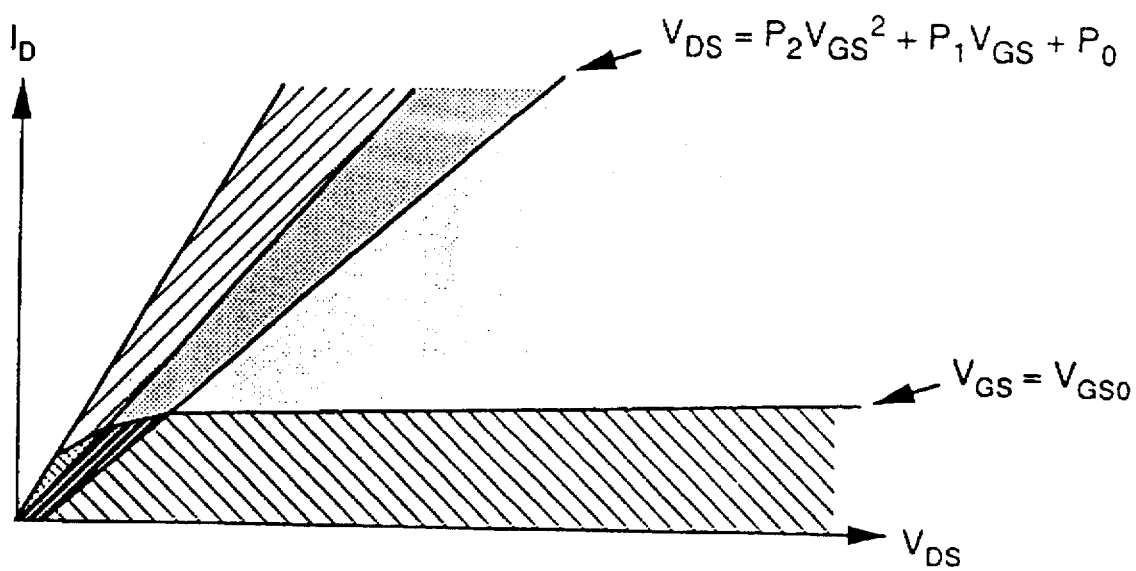
FIG. 3 is a diagram in which the region of operation of a MOS transistor equivalent model of the first embodiment of the present invention is divided into plural subregions.
Figure 4:
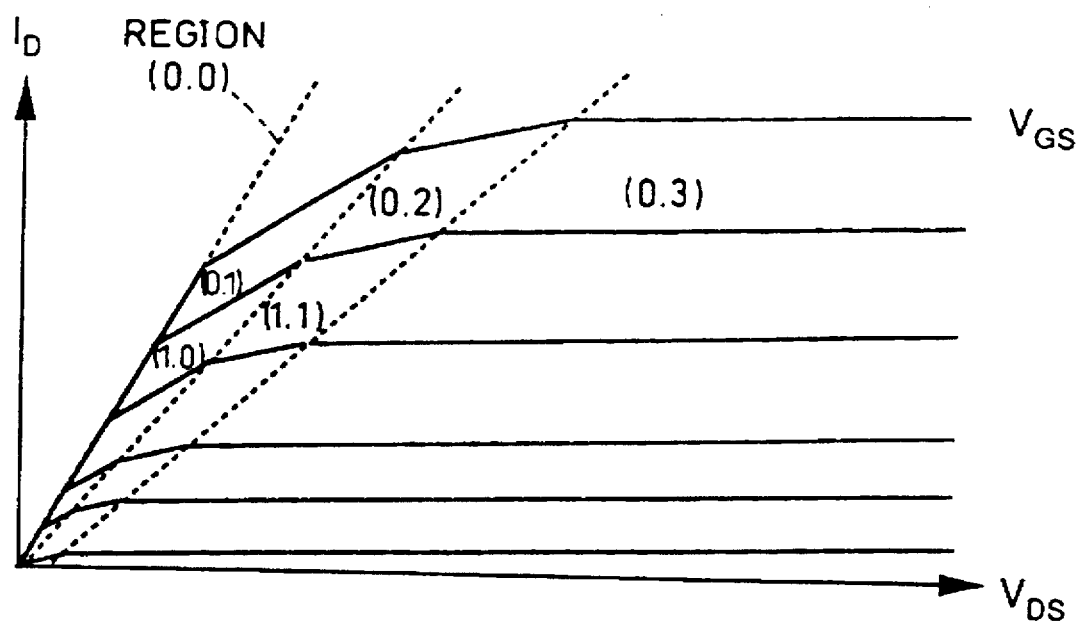
FIG. 4 shows I-V characteristics of a MOS transistor basic model of the first embodiment of the present invention.

Referring again to FIG. 1, reference numeral 3 is a device parameter memory section (DPMS). Prestored in DPMS 3 are parameters R, $G_m$, and $V_T$ where R is the value of the resistor element's R resistance, $G_m$ is the coefficient, and $V_T$ is the threshold voltage. As shown in FIG. 3, the region of operation of a MOS transistor is divided into plural subzones according to the drain, source, and gate terminal voltages of the MOS transistor and the terminal voltage of the substrate and, as shown in FIG. 4, each of the subzones is further divided into plural subranges. DPMS 3 prestores values of the parameters R, $G_m$, and $V_T$ for the subranges as shown in FIG. 5. Each of the parameters R, $G_m$, and $V_T$ is stored in the form of a value normalized by the size of the MOS transistor. FIG. 4 shows I–V characteristics of the MOS transistor derived from an equivalent model composed of the FIG. 2(b) connection configuration and the parameters R, $G_m$, and $V_T$. In the case of taking into account the values of the interterminal (terminal-to-terminal) capacitances of the MOS transistor, each interterminal capacitance value is also stored in DPMS 3 for each subrange in order to incorporate effects depending upon the MOS transistor interterminal voltage.

PU 2 includes a component size extraction section (CSES) 2b, a circuit parameter calculation section (CPCS) 2c, and a circuit equation derivation section (CEDS) 2d.

CSES 2b extracts a MOS transistor gate size stored in CCIMS 1. CPCS 2c reads, out of DPMS 3, parameters R, $G_m$, and $V_T$ each of which corresponds to a subrange of the subranges of FIG. 4. Thereafter, based on these parameters and based on the gate size read out of DPMS 3, CPCS 2c calculates parameters $R_k$, $G_{mk}$, and $V_{Tk}$ that are the parameters of an actual MOS transistor constructing the FIG. 6(a) CMOS inverter circuit, where k=1 and n is the number of MOS transistors constructing a semiconductor circuit to be analyzed. Note that n=2 with respect to the FIG. 6(b) CMOS inverter circuit's equivalent circuit.

Based on the equivalent circuit of the CMOS inverter circuit produced by EMRS 2a and the parameters $R_k$, $G_{mk}$, and $V_{Tk}$ calculated by CPCS 2c, CEDS 2d derives a circuit equation that represents a relationship between the output voltage of the FIG. 6(b) CMOS inverter circuit's equivalent circuit and the electric current i. Such a circuit equation is the following equation (2):

$$\frac{v_o - V_{DD}}{R_2} + i_2 + \frac{v_o}{R_1} + i_1 + C\frac{dv_o}{dt} = 0$$

-continued $$i_1 = G_{m1}(v_{GS1} - V_{T1}) = G_{m1}(v_i - V_{T1})$$
$$i_2 = G_{m2}(v_{GS2} - V_{T2}) = G_{m2}(v_i - V_{DD} - V_{T2})$$

As can be seen from the above, Eq. (2) is a linear non-time-varying differential equation.

Referring again to FIG. 1, reference numeral 4 is an input waveform data memory section (IWDMS). Prestored in IWDMS 4 are waveform data as to $v_i$ (i.e., a voltage that is applied to two MOS transistors constituting the FIG. 6(a) CMOS inverter circuit). The input voltage $v_i$ varies in value with time; however, when partitioned for given periods, the input voltage $v_i$ for each given period can be given by the following linear equation (3):

$$v_i = A_t + B$$

where A is the coefficient and B is the constant. IWDMS 4 stores values of the coefficient A and values of the constant B by the given periods.

PU 2 has a waveform input section (WIS) 2e, a circuit equation analysis section (CEAS) 2f, and a waveform output section (WOS) 2g. WIS 2e inputs the input waveform data $v_i$ stored in IWDMS 4.

CEAS 2f computes output voltage waveforms of the semiconductor circuit to be analyzed on the basis of the circuit equation derived by CEDS 2d and the input waveform data inputted by WIS 2e. With regard to the FIG. 6(b) CMOS inverter circuit's equivalent circuit, $v_o$, i.e., the output voltage waveform, is given by the following equation (4):

$$vo = \left(\frac{K_3}{K_1} - \frac{CK_2}{K_1^2} + v_{o0}\right) e^{-\frac{K_1}{C}t} - \frac{K_2}{K_1}t + \frac{CK_2 - K_1K_3}{K_1^2}$$

$$K_1 = \frac{1}{R_1} + \frac{1}{R_2}$$

$$K_2 = A(G_{m1} + G_{m2})$$

$$K_3 = B(G_{m1} + G_{m2}) - VDD\left(G_{m2} + \frac{1}{R_2}\right) - G_{m1}V_{T1} - G_{m2}V_{T2}$$

It is clear from Eq. (4) that the output voltage waveform $v_o$ can be found by means of mathematical analysis with depending upon no numerical calculations.

CEAS 2f repeatedly performs solving processing to obtain a solution from an initial value while at the same time sequentially changing $G_{mk}$, $R_k$, $V_{Tk}$, A, and B by the subranges of FIG. 4 corresponding to the respective terminal voltages of the MOS transistor and according to the switch time of the linear input waveform $v_i$, to calculate waveform information of the output voltage $v_o$ of the FIG. 6(a) CMOS inverter circuit. As a result, the operation of the FIG. 6(a) CMOS inverter circuit is evaluated.

WOS 2g inputs the waveform information from CEAS 2f for forwarding to outside PU 2.

In FIG. 1, reference numeral 5 is an output waveform data memory section (OWDMS) for storing the waveform information of the output voltage $v_o$ from WOS $2_g$, and reference numeral 6 is a display terminal unit for displaying the waveform information of the output voltage $v_o$ stored in OWDMS 5.

In the present embodiment, a MOS transistor equivalent model, shown in FIG. 2(b), is preset. As can be seen from FIG. 2(b), this MOS transistor equivalent model shows a connection configuration made up of ECS 10 and the resistor element R that is connected in parallel with ECS 10. The electric current i supplied by ECS 10 is represented, as shown in Eq. (1), by a linear equation proportional to the value obtained by subtracting $V_T$ (the threshold voltage) from $V_{GS}$ (the gate-to-source input voltage). Respective values of $G_m$, R, and $V_T$ of Eq. (1) are preset for the subranges of FIG. 4 and are stored in DPMS 3.

When trying to analyze the performance characteristic of, for example, the FIG. 6(b) CMOS inverter circuit composed of two MOS transistors, each of the two MOS transistors is replaced by the FIG. 2(b) connection configuration, to derive the FIG. 6(b) CMOS inverter circuit's equivalent circuit. As a result, the circuit equation of the equivalent circuit becomes a circuit equation taking the form of a linear time-invariant differential equation, i.e., Eq. (2).

The aforesaid circuit equation, since it is a linear time-invariant differential equation, can be solved with ease. Prior to solving the circuit equation, the input signal $v_i$ to the equivalent circuit is partitioned for given periods, the input signal $v_i$ for each period is considered a linear signal as shown in Eq. (3), and the coefficient A and the constant B of this linear input signal are prestored in IWDMS 4 by the given periods. Thereafter, when solving the circuit equation, the coefficient A as well as the constant B is changed for every given period of the input signal $v_i$ and, at the same time, every time the operating state of the MOS transistor makes a transition from one subrange to another (see FIG. 4) due to variation in the MOS transistor terminal voltage accompanied with variation in the value of the input signal $v_i$, values of the parameters $G_m$ and R each corresponding to a post-transition subrange are repeatedly read from DPMS 3, to calculate the output voltage $v_o$ of the equivalent circuit.

The circuit equation of the equivalent circuit described above is a linear time-invariant differential equation which can be solved with ease, whereupon the performance characteristic of the CMOS inverter circuit can be accurately analyzed at a high speed.

In terms of recent submicron MOS transistors, the drain current is represented with a linear equation of the gate-to-source voltage. In accordance with the present embodiment, an equivalent model of the MOS transistor represents the drain current with a linear equation of the gate-to-source voltage (see Eq. (1)), which is suitable for current MOS transistors. The equivalent model of the present embodiment is the equivalent model without serious differences with respect to the characteristic of an actual MOS transistor.

Additionally, $G_m$ and R stored in DPMS 3 are normalized by the size of MOS transistor unit gate. Accordingly, even when the gate size of actual MOS transistors forming a semiconductor circuit to be analyzed is either larger or smaller, $G_m$ and R corresponding to an actual gate size can be obtained by performing multiplication on the aforesaid normalized $G_m$ and R, in other words it is sufficient that only one type of $G_m$ and one type of R are stored in DPMS 3, regardless of the actual MOS transistor gate size. This eliminates the need for entering into DPMS 3 various coefficients and resistance values for every actual MOS transistor gate size, thereby reducing the storage capacity of DPMS 3.

EMBODIMENT 2

A second embodiment of the present invention is described. The second embodiment shows an improvement of the MOS transistor equivalent model of the first embodiment.

Figure 8A:
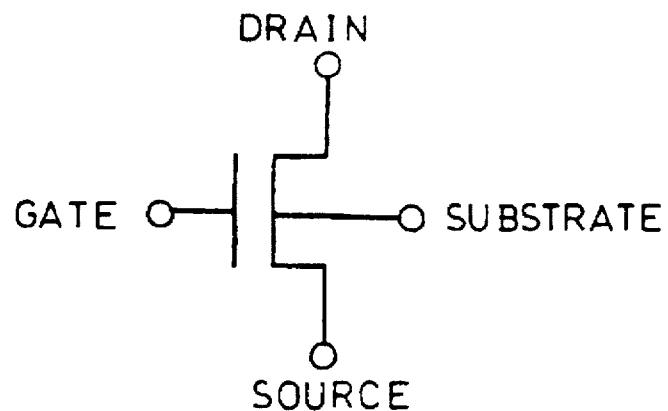
FIG. 8(a) shows a MOS transistor of the second embodiment of the present invention and FIG. 8(b) shows an equivalent model to a MOS transistor of the second embodiment of the present invention.
Figure 8B:
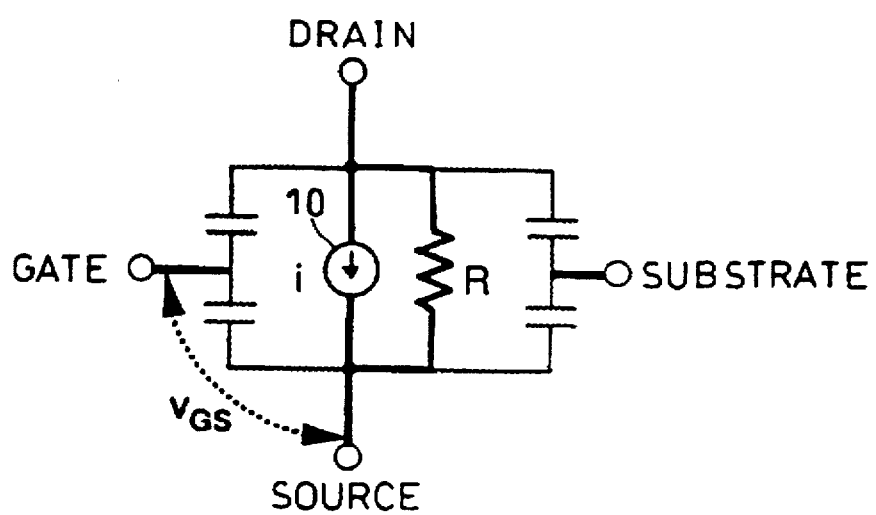
Figure 9:
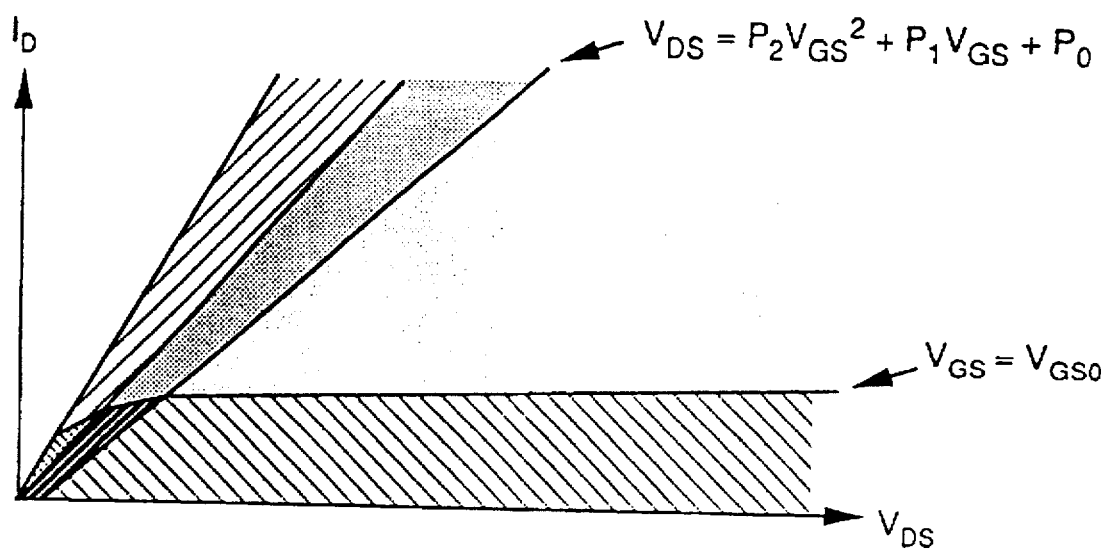
FIG. 9 is a diagram in which the region of operation of a MOS transistor equivalent model of the second embodiment of the present invention is divided into plural subregions.

An EMRS 2a' of FIG. 7 stores an equivalent model of FIG. 8(b) to a MOS transistor of FIG. 8(a). The FIG. 8(b) equivalent model is identical in connection configuration with the FIG. 2(b) equivalent model except that the electric current equation of the former model is different from that of the latter model. In the electric current equation of the present equivalent model, the electric current i, as shown in the following equation (5), includes two regions one of which is a first region capable of being represented by a linear equation of the MOS transistor gate-to-source voltage $V_{GS}$ and the other of which is a second region capable of being represented by a quadratic equation. The first region, on the one hand, is a region if $V_{GS} \geq V_{GS0}$ while on the other hand the second region is a region if $V_T \geq V_{GS} < V_{GS0}$. The current i for each region can be given by the following current equation (5).

$$i = G_{m1}(V_{GS} - V_{GS0})\ V_{GS} \geq V_{GS0}$$

$$i = G_{m2}(V_{GS} - V_T)^2\ V_T \geq V_{GS} < V_{GS0}$$

$$V_{GS} < V_T\ \text{then}\ G_m = 0,\ R = \infty$$

Note: if

Figure 10:
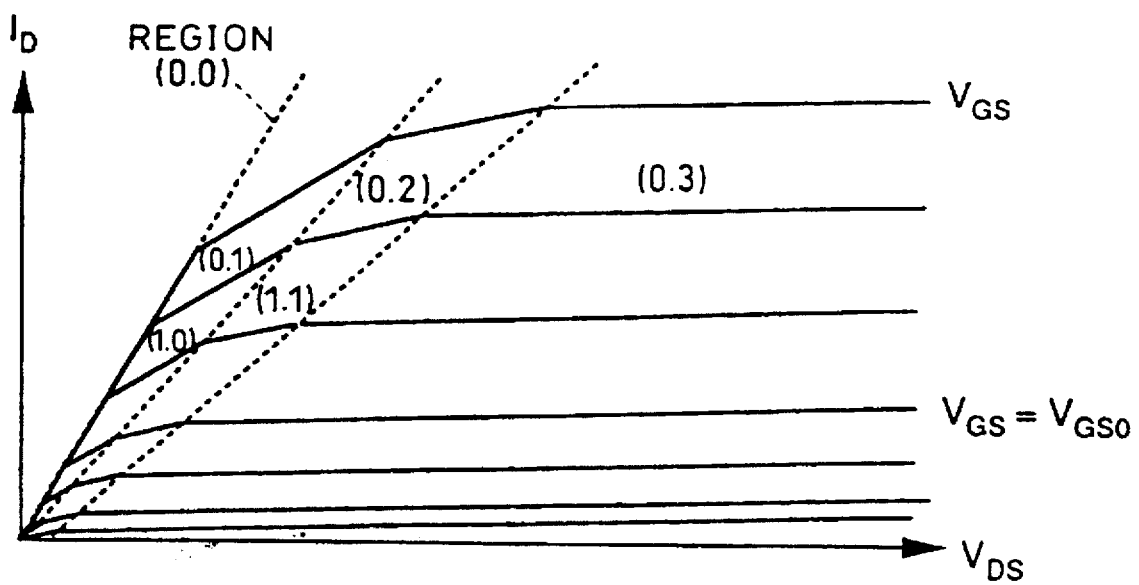
FIG. 10 shows I-V characteristics of a MOS transistor basic model of the second embodiment of the present invention.

Because of the above improvement, each of R of the FIG. 8(b) equivalent model and $G_{m1}$ and $G_{m2}$ of Eq. (5) has different values for MOS transistor subranges of FIG. 10. These R, $G_{m1}$, and $G_{m2}$ values are stored in a DPMS 3' of FIG. 7. FIG. 10 shows I–V characteristics of the MOS transistor derived from the FIG. 8(b) equivalent model and the parameters R, $G_{m1}$, $G_{m2}$ and $V_T$. With regard to the interterminal (terminal-to-terminal) capacitance values of the FIG. 8(a) MOS transistor, individual interterminal capacitance values are set for respective subranges of FIG. 10, as in the first embodiment.

Figure 11A:
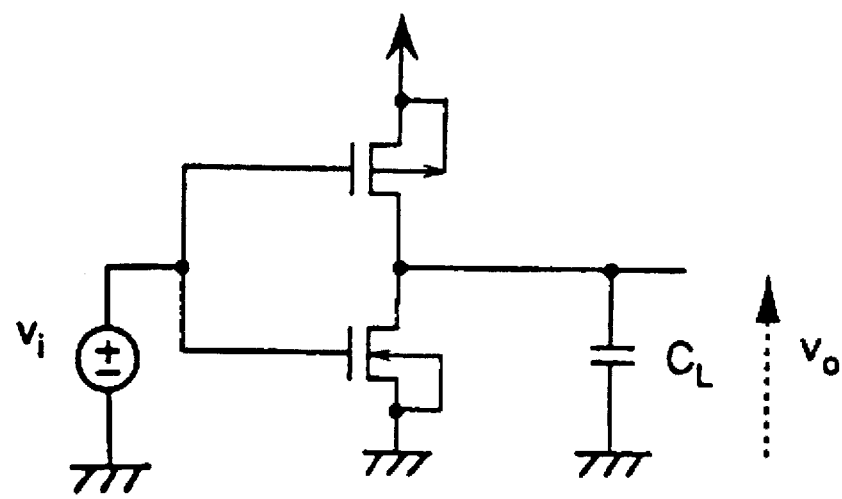
FIG. 11(a) schematically depicts a CMOS inverter circuit of the second embodiment of the present invention serving as a semiconductor circuit to be analyzed in performance characteristic and FIG. 11(b) schematically depicts an equivalent circuit to a CMOS inverter circuit of the second embodiment of the present invention serving as a semiconductor circuit to be analyzed in performance characteristic.
Figure 11B:
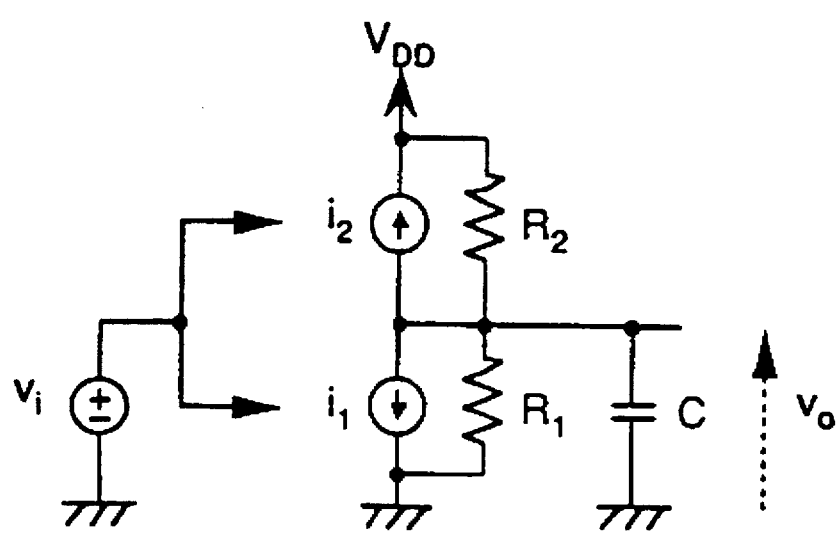
Figure 12A:
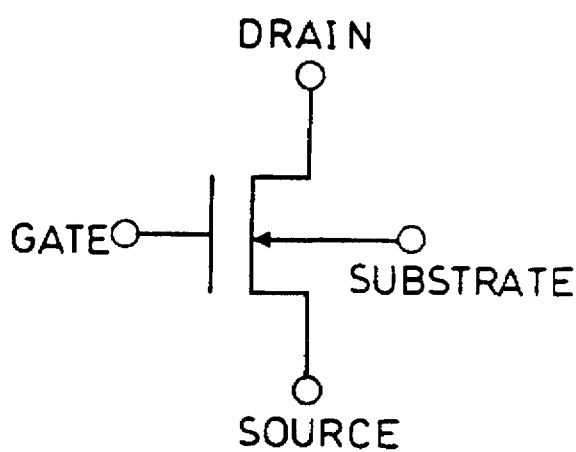
FIG. 12(a) shows the structure of a conventional MOS transistor and FIG. 12(b) shows a model of a conventional MOS transistor.
Figure 12B:
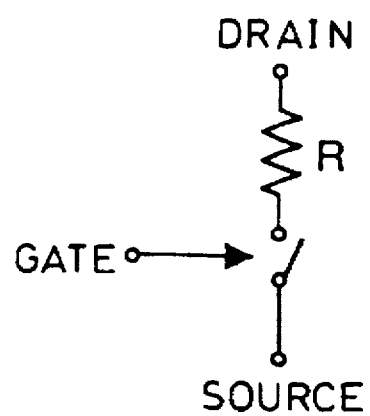

In accordance with the present embodiment, when analyzing a semiconductor circuit with the aid of the equivalent model of FIG. 8(b), in other words when evaluating the input/output characteristics of the CMOS inverter circuit of FIG. 11(a), its equivalent circuit structure can be modeled by a connection configuration completely identical with the one shown in FIG. (b) (see FIG. 11(b)). The electric current equation of the electric current i supplied by ECS 10 becomes the following circuit equation (6):

$$\frac{v_o - V_{DD}}{R_2} + i_2 + \frac{v_o}{R_1} + i_1 + C\frac{dv_o}{dt} = 0$$

$$i_1 = G_{m11}(v_i - V_{T11})\ \text{or}\ i_1 = G_{m12}(v_i - V_{T12})^2$$
$$i_2 = G_{m21}(v_i - V_{DD} - V_{T21})\ \text{or}\ i_2 = G_{m22}(v_i - V_{DD} - V_{T22})^2$$

It is clear that Eq. (6) is a linear non-time-varying differential equation. In the region where the magnitude of the electric current i can be represented by a linear equation of $V_{GS}$, $v_o$ is represented the same way that it is represented in the first embodiment. On the other hand, in the region where the magnitude of the electric current i can be represented by a quadratic equation, $v_o$ is given by the following circuit equation (7):

$$vo = \frac{2C^2K_2 - CK_1K_3 + K_1^2K_4}{K_1^3} + voO\ \bigg)\ e^{-\frac{K_1}{C}t} - \frac{K_2}{K_1}t^2 +$$

$$\frac{2CK_2 - K_1K_3}{K_1^2}t + \frac{-2C^2K_2 + CK_1K_3 - K_1^2K_4}{K_1^3}$$

$$K_1 = \frac{1}{R_1} + \frac{1}{R_2}$$

$$K_2 = A^2(G_{m12} + G_{m22})$$
$$K_3 = 2A(B(G_{m12} + G_{m22}) - (G_{m12}V_{T1} + G_{m22}V_{T2} + G_{m22}V_{DD}))$$

-continued $$K_4 = G_{m12}(B - V_{T1})^2 + G_{m22}(B - V_{T2} - V_{DD})^2 - \frac{V_{DD}}{R_2}$$

The above is the same as the case where input waveforms are equivalently represented by a quadratic equation. Accordingly such a quadratic equation can be solved analytically with ease, as in the first embodiment.

The invention claimed is:

1. An analytic method for analyzing a performance characteristic of a semiconductor circuit containing MOS transistors, said analytic method comprising:
   (a) premodeling a characteristic of a MOS transistor with an equivalent model;
      wherein said equivalent model shows a connection configuration which is composed of an electric current source for providing an electric current i and a resistor element connected in parallel with said electric current source;
      wherein said electric current i is given by the equation of $i = G_m \cdot (V_{GS} - V_T)$ for $V_{GS} \geq V_T$ where $G_m$ is a coefficient, $V_{GS}$ is a gate-to-source input voltage of said MOS transistor, and $V_T$ is a given threshold voltage;
      wherein values of said coefficient $G_m$ and values of said resistor element's resistance are set for a plurality of operation regions of said MOS transistor which are defined according to drain, source, and gate terminal voltages of said MOS transistor;
   (b) replacing said MOS transistors of said semiconductor circuit that is analyzed with said MOS transistor equivalent model;
   (c) deriving a circuit equation which expresses a relationship between the output voltage of said MOS transistor equivalent model circuit and said electric current i;
   (d) solving said circuit equation;
      wherein said circuit equation is reduced by means of CAD (computer aided design) to a linear time-invariant differential equation and said linear time-invariant differential equation is solved so as to analyze said performance characteristic of said semiconductor circuit.

2. An analytic method for analyzing a performance characteristic of a semiconductor circuit containing MOS transistors, said analytic method comprising:
   (a) premodeling a characteristic of a MOS transistor with an equivalent model;
      wherein said equivalent model shows a connection configuration which is composed of an electric current source for providing an electric current i and a resistor element connected in parallel with said electric current source;
      wherein said electric current i is given by the equation of $i = G_{m1} \cdot (V_{GS} - V_{GS0})$ for $V_{GS} \geq V_{GS0}$, where $G_{m1}$ is a coefficient, $V_{GS}$ is a gate-to-source input voltage of said MOS transistor, and $V_{GS0}$ is a first given threshold voltage;
      wherein said electric current i is further given by the equation of $i = G_{m2} \cdot (V_{GS} - V_T)^2$ for $V_T \leq V_{GS} < V_{GS0}$, where $G_{m2}$ is a coefficient and $V_T$ is a second given threshold voltage;
      wherein values of said coefficient $G_{m1}$, values of said coefficient $G_{m2}$, and values of said resistor element's resistance are set for a plurality of operation regions of said MOS transistor which are defined according to drain, source, and gate terminal voltages of said MOS transistor;
   (b) replacing said MOS transistors of said semiconductor circuit that is analyzed with said MOS transistor equivalent model;
   (c) deriving a circuit equation which expresses a relationship between the output voltage of said MOS transistor equivalent model circuit and said electric current i;
   (d) solving said circuit equation;
      wherein said circuit equation is reduced by means of CAD (computer aided design) to a linear time-invariant differential equation and said linear time-invariant differential equation is solved so as to analyze said performance characteristic of said semiconductor circuit.

3. An analytic system for analyzing a performance characteristic of a semiconductor circuit containing components including MOS transistors, said analytic system comprising:
   (a) a circuit connection information memory for storing pieces of intercomponent connection information as to connections between said components of said semiconductor circuit;
   (b) replacement means for:
      (b-1) prestoring an equivalent model which models a characteristic of a MOS transistor;
         wherein said equivalent model shows a connection configuration which is composed of an electric current source for providing an electric current i and a resistor element connected in parallel with said electric current source;
         wherein said electric current i is given by the equation of $i = G_m \cdot (V_{GS} - V_T)$ for $V_{GS} \geq V_T$ where $G_m$ is a coefficient, $V_{GS}$ is a gate-to-source input voltage of said MOS transistor, and $V_T$ is a given threshold voltage;
      (b-2) inputting said pieces of intercomponent connection information from said circuit connection information memory;
      (b-3) extracting said MOS transistors from among said pieces of intercomponent connection information;
      (b-4) replacing a drain-to-source connection of said extracted MOS transistor with said equivalent model, to derive an equivalent circuit to said semiconductor circuit;
   (c) a parameter memory for storing values of said coefficient $G_m$ and values of said resistor element's resistance for a plurality of operation regions of said MOS transistor which are defined according to drain, source, and gate terminal voltages of said MOS transistor;
   (d) circuit equation derivation means for deriving a circuit equation which expresses a relationship between the output voltage of said equivalent circuit derived by said replacement means and said electric current i;
   (e) an equation analyzer for:
      (e-1) inputting a signal which is applied to said semiconductor circuit and which sequentially varies in value;
      (e-2) reading, out of said parameter memory, a value of said coefficient $G_m$ and a value of said resistor element's resistance of an operation region of said plural operation regions corresponding to a value of said signal;
      (e-3) solving a circuit equation derived by said circuit equation derivation means;
   wherein:
      said circuit equation is reduced by means of CAD (computer aided design) to a linear time-invariant differential equation and said linear time-invariant differential equation is solved so as to analyze said performance characteristic of said semiconductor circuit.

4. An analytic system for analyzing a performance characteristic of a semiconductor circuit according to claim 3, said parameter memory means storing said values of said coefficient $G_m$ and said values of said resistor element's resistance in the form of values normalized by MOS transistor gate sizes;

said circuit connection information memory storing sizes of said MOS transistors constructing said semiconductor circuit;

said analytic system further comprising:
(f) component size extraction means for reading a MOS transistor gate size of said MOS transistor gate sizes out of said circuit connection information memory;
(g) parameter calculation means for:
   (g-1) inputting said MOS transistor gate size read by said component size extraction means;
   (g-2) reading a value of said coefficient $G_m$ and a value of said resistor element's resistance out of said parameter memory;
   (g-3) computing values of said coefficient $G_m$ and values of said resistor element's resistance corresponding to actual MOS transistors constructing said semiconductor circuit.

5. An analytic system for analyzing a performance characteristic of a semiconductor circuit containing components including MOS transistors, said analytic system comprising:
(a) a circuit connection information memory for storing pieces of intercomponent connection information as to connections between said components of said semiconductor circuit;
(b) replacement means for:
   (b-1) prestoring an equivalent model which models a characteristic of a MOS transistor;
      wherein said equivalent model shows a connection configuration which is composed of an electric current source for providing an electric current i and a resistor element connected in parallel with said electric current source;
      wherein said electric current i is given by the equation of $i = G_{m1} \cdot (V_{GS} - V_{GS0})$ for $V_{GS} \geq V_{GS0}$ where $G_{m1}$ is a coefficient, $V_{GS}$ is a gate-to-source input voltage of said MOS transistor, and $V_{GS0}$ is a first given threshold voltage;
      wherein said electric current i is further given by the equation of $i = G_{m2} \cdot (V_{GS} - V_T)^2$ for $V_T \leq V_{GS} < V_{GS0}$, where $G_{m2}$ is a coefficient and $V_T$ is a second given threshold voltage;
   (b-2) inputting said pieces of intercomponent connection information from said circuit connection information memory;
   (b-3) extracting said MOS transistors from among said pieces of intercomponent connection information;
   (b-4) replacing a drain-to-source connection of said extracted MOS transistor with said equivalent model, to derive an equivalent circuit to said semiconductor circuit;
(c) a parameter memory for storing values of said coefficient $G_{m1}$, values of said coefficient $G_{m2}$, and values of said resistor element's resistance for a plurality of operation regions of said MOS transistor which are defined according to drain, source, and gate terminal voltages of said MOS transistor;
(d) circuit equation derivation means for deriving a circuit equation which expresses a relationship between the output voltage of said equivalent circuit derived by said replacement means and said electric current i;
(e) an equation analyzer for:
   (e-1) inputting a signal which is applied to said semiconductor circuit and which sequentially varies in value;
   (e-2) reading, out of said parameter memory, a value of said coefficient $G_{m1}$, a value of said coefficient $G_{m2}$, and a value of said resistor element's resistance of an operation region of said plural operation regions corresponding to a value of said signal;
   (e-3) solving a circuit equation derived by said circuit equation derivation means;
wherein:
   said circuit equation is reduced by means of CAD (computer aided design) to a linear time-invariant differential equation and said linear time-invariant differential equation is solved so as to analyze said performance characteristic of said semiconductor circuit.

6. An analytic system for analyzing a performance characteristic of a semiconductor circuit according to claim 5, said parameter memory means storing said values of said coefficient $G_{m1}$, said values of said coefficient $G_{m2}$, and said values of said resistor element's resistance in the form of values normalized by MOS transistor gate sizes;

said circuit connection information memory storing sizes of said MOS transistors constructing said semiconductor circuit;

said analytic system further comprising:
(f) component size extraction means for reading a MOS transistor gate size of said MOS transistor gate sizes out of said circuit connection information memory;
(g) parameter calculation means for:
   (g-1) inputting said MOS transistor gate size read by said component size extraction means;
   (g-2) reading a value of said coefficient $G_{m1}$, a value of said coefficient $G_{m2}$, and a value of said resistor element's resistance out of said parameter memory;
   (g-3) computing values of said coefficient $G_{m1}$, values of said coefficient $G_{m2}$, and values of said resistor element's resistance corresponding to actual MOS transistors constructing said semiconductor circuit.

* * * * *